United States Patent
Yamada

(10) Patent No.: US 11,881,868 B2
(45) Date of Patent: Jan. 23, 2024

(54) CONTROL SYSTEM, DISCONNECTION DETECTION METHOD, AND NON-TRANSITORY COMPUTER-READABLE MEDIUM

(71) Applicant: MITSUBA Corporation, Gunma (JP)

(72) Inventor: Miya Yamada, Gunma (JP)

(73) Assignee: MITSUBA Corporation, Gunma (JP)

(*) Notice: Subject to any disclaimer, the term of this patent is extended or adjusted under 35 U.S.C. 154(b) by 43 days.

(21) Appl. No.: 17/737,007

(22) Filed: May 4, 2022

(65) Prior Publication Data

US 2023/0075090 A1   Mar. 9, 2023

(30) Foreign Application Priority Data

Sep. 9, 2021   (JP) .................... 2021-147004

(51) Int. Cl.
   *H03M 1/06*   (2006.01)
   *H03M 1/10*   (2006.01)
   *H03M 1/00*   (2006.01)

(52) U.S. Cl.
   CPC .......... *H03M 1/1076* (2013.01); *H03M 1/002* (2013.01)

(58) Field of Classification Search
   CPC .......... H03M 1/363; H03M 1/12; H03M 1/06; H03M 1/0612; H03M 1/0845; H03M 1/181; H03M 1/56; H03M 1/74; H03M 1/785; H03M 5/02; H03M 7/30; H03M 1/129; H03M 1/26; H03M 1/36; H02P 29/032; H02P 2101/45; H02P 9/02; H02P 9/10; H02P 9/08; H02P 9/102; H02P 9/107; H02P 9/30; H02P 9/305; H02P 9/48

USPC .................... 341/119, 120, 116, 117
   See application file for complete search history.

(56) References Cited

U.S. PATENT DOCUMENTS

| | | | | |
|---|---|---|---|---|
| 5,483,635 | A * | 1/1996 | Kameyama | G06F 1/30 307/64 |
| 6,239,732 | B1 * | 5/2001 | Cusey | G06F 3/05 341/120 |
| 7,285,938 | B2 * | 10/2007 | Aoyama | H02P 9/10 322/36 |
| 7,606,955 | B1 * | 10/2009 | Falik | G06F 13/4295 710/110 |
| 9,071,177 | B2 * | 6/2015 | Chassard | H02P 9/08 |

(Continued)

FOREIGN PATENT DOCUMENTS

JP   2020139787   9/2020

*Primary Examiner* — Linh V Nguyen
(74) *Attorney, Agent, or Firm* — JCIPRNET

(57) ABSTRACT

A control system includes: a semiconductor chip, having built therein a processing part, an A/D converter and a pull device circuit; a wiring part, having one end connected to a terminal connected to the A/D converter; and a sensor, connected to the other end of the wiring part and inputting a sensor signal in analog form via the wiring part. The pull device circuit includes a switching element, and has one end connected to ground or a power supply voltage and the other end connected between the A/D converter and the terminal. The processing part includes: a switch control part, controlling the switching element to be in an on or off state; a sensor information generator, generating sensor information based on the sensor signal; and a disconnection detector, detecting disconnection of the wiring part based on output of the A/D converter when the switching element is in the on state.

7 Claims, 6 Drawing Sheets

(56) References Cited

U.S. PATENT DOCUMENTS

| | | | | |
|---|---|---|---|---|
| 9,995,778 B1* | 6/2018 | Fiori, Jr. | ............ | G01R 27/2611 |
| 10,771,080 B1* | 9/2020 | Bacigalupo | .......... | H03K 17/567 |
| 2007/0085510 A1* | 4/2007 | Asada | ................... | H02P 29/032 |
| | | | | 322/28 |
| 2007/0126619 A1* | 6/2007 | McGrath | ............... | H03M 3/392 |
| | | | | 341/155 |
| 2017/0317021 A1* | 11/2017 | Iyoshi | .................... | H03M 1/12 |

* cited by examiner

CONTROL SYSTEM, DISCONNECTION DETECTION METHOD, AND NON-TRANSITORY COMPUTER-READABLE MEDIUM

CROSS-REFERENCE TO RELATED APPLICATIONS

This application claims the priority benefit of Japan Application No. 2021-147004, filed on Sep. 9, 2021. The entirety of the above-mentioned patent application is hereby incorporated by reference herein and made a part of this specification.

BACKGROUND

Technical Field

The disclosure relates to a control system, a disconnection detection method, and a disconnection detection program.

Related Art

An electronic control device is known including: a ground terminal for grounding a shielded wire used to output a drive signal to an inductive load via a drain wire; a series circuit of a resistor element and a switching element connected between a power supply and the ground terminal; and a disconnection detector detecting disconnection of the drain wire by switching the switching element on and off.
[Patent Document 1] Japanese Patent Laid-open No. 2020-139787

In a configuration in which an analog sensor signal is input to a terminal of a semiconductor chip via a wiring part, it is useful to be able to realize a mechanism capable of detecting disconnection of the wiring part at low cost without adding a new component.

SUMMARY

One aspect of the disclosure provides a control system. The control system includes: a semiconductor chip, having built therein a processing part, an A/D converter and a pull device circuit; a wiring part, having one end connected to a terminal connected to the A/D converter; and a sensor, connected to the other end of the wiring part and inputting a sensor signal in analog form to the terminal via the wiring part. The pull device circuit includes a switching element, and has one end connected to ground or a power supply voltage and the other end connected between the A/D converter and the terminal. The processing part includes: a switch control part, controlling the switching element to be in an on or off state; a sensor information generator, generating sensor information based on the sensor signal; and a disconnection detector, detecting disconnection of the wiring part based on output of the A/D converter when the switching element is in the on state.

DESCRIPTION OF THE EMBODIMENTS

In the disclosure, in a configuration in which an analog sensor signal is input to a terminal of a semiconductor chip via a wiring part, disconnection of the wiring part is detected without adding a new component.

According to the disclosure, in the configuration in which the analog sensor signal is input to the terminal of the semiconductor chip via the wiring part, it is possible to detect the disconnection of the wiring part without adding a new component (by using a pull device circuit built in the semiconductor chip).

Hereinafter, embodiments of the disclosure are described with reference to the drawings.

Figure 1:
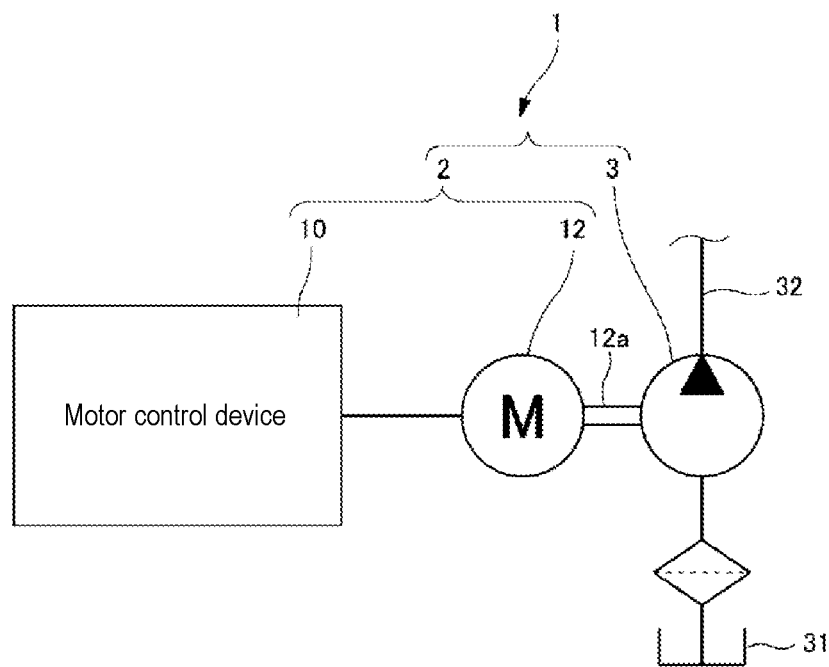
FIG. 1 schematically illustrates an embodiment of a hydraulic pressure generation device.

FIG. 1 schematically illustrates an embodiment of a hydraulic pressure generation device 1.

The hydraulic pressure generation device 1 is a device that generates hydraulic pressure, and is preferably mounted on a vehicle. As shown in FIG. 1, the hydraulic pressure generation device 1 includes a motor drive system 2 and a hydraulic pump 3.

The motor drive system 2 includes a motor control device 10 and a motor 12.

The motor control device 10 controls the hydraulic pump 3 by controlling the motor 12. The motor control device 10 is a processing device including a microcomputer 110 or the like. The motor control device 10 has a hardware configuration that is arbitrary and can be the same as that of an in-vehicle electronic control unit (ECU).

In the motor 12, an output shaft 12a functions as a drive shaft of the hydraulic pump 3. The motor 12 is a three-phase brushless motor. However, the number of phases is not limited thereto, and the detailed configuration is arbitrary. The motor 12 may be connected to the hydraulic pump 3 directly or via another mechanism (not shown) or the like.

The hydraulic pump 3 is an electric pump. When driven, the hydraulic pump 3 sucks oil in a tank 31 and discharges the same to a supply path 32.

In this way, the hydraulic pressure generation device 1 of the present embodiment generates hydraulic pressure by driving the hydraulic pump 3 via the motor drive system 2. The hydraulic pressure generated by the hydraulic pump 3 (that is, the oil discharged from the hydraulic pump 3) can be used in driving an actuator, cooling a heating component of various in-vehicle electronic devices, or lubricating a movable part.

Figure 2:
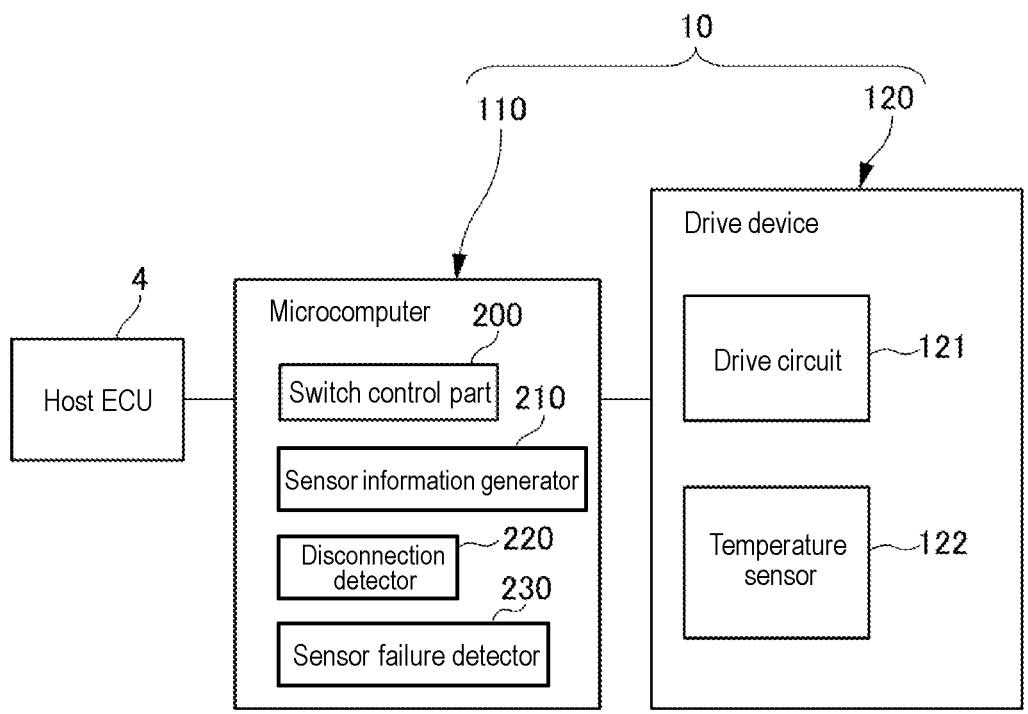
FIG. 2 is a configuration diagram schematically illustrating an embodiment of a motor control device.
Figure 3:
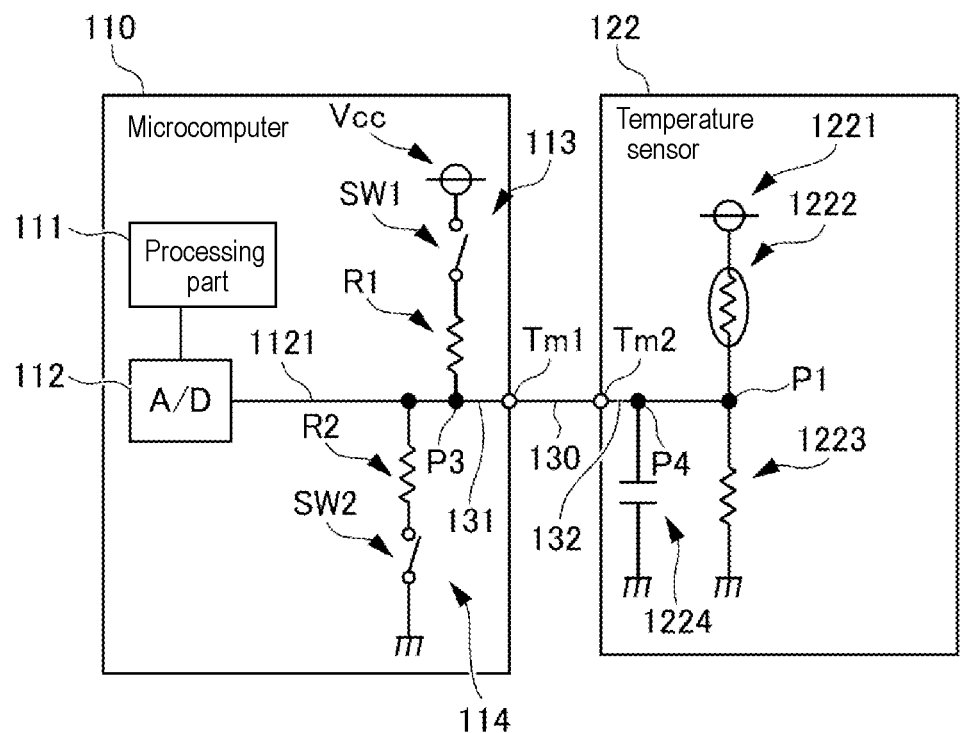
FIG. 3 is a schematic diagram illustrating an internal configuration of each of a microcomputer and a temperature sensor.

FIG. 2 is a configuration diagram schematically illustrating an embodiment of the motor control device 10. FIG. 2 also shows a host ECU 4 as a related configuration. FIG. 3 is a schematic diagram illustrating an internal configuration of each of the microcomputer 110 and a temperature sensor 122.

The host ECU 4 is an example of a control device of a higher order than the motor control device 10, and gives various commands to the motor control device 10.

The motor control device 10 includes the microcomputer 110 and a drive device 120 as shown in FIG. 2.

The microcomputer 110 controls the motor 12 via the drive device 120 in response to the various commands from the host ECU 4. The microcomputer 110 monitors a temperature of the drive device 120 based on sensor information (described later) from the temperature sensor 122 of the drive device 120.

The microcomputer 110 is in the form of a semiconductor chip, and includes a processing part 111, an A/D converter 112, a pull-up circuit 113, and a pull-down circuit 114 as shown in FIG. 3.

The processing part 111 includes a central processing unit (CPU), a storage and the like, and performs various arithmetic processings.

The A/D converter 112 converts an analog signal input thereto into a digital signal and outputs the same. In the present embodiment, an electric signal is input to the A/D converter 112 from the temperature sensor 122 of the drive device 120. The A/D converter 112 inputs the output in the form of a digital signal to the processing part 111.

The pull-up circuit 113 has one end connected to a power supply voltage Vcc (for example, 5 V) and the other end connected to an input line 1121 to the A/D converter 112. The input line 1121 is an internal wire of the microcomputer 110, and has one end connected to a terminal Tm1 of the microcomputer 110 and the other end connected to the A/D converter 112.

The pull-up circuit 113 includes a switching element SW1 and a resistor R1. The switching element SW1 is in the form of, for example, a transistor (for example, bipolar transistor). The resistor R1 is a fixed resistor and may have a resistance value in the range of, for example, 25 kΩ to 127 kΩ.

The pull-up circuit 113 is able to turn on/off its own function by turning on/off the switching element SW1. In the following, turning on/off the pull-up circuit 113 means turning on/off a function of the pull-up circuit 113 by turning on/off the switching element SW1.

The pull-down circuit 114 has one end connected to ground and the other end connected to the input line 1121 to the A/D converter 112. The pull-down circuit 114 includes a switching element SW2 and a resistor R2. The switching element SW2 is in the form of, for example, a transistor (for example, bipolar transistor). The resistor R2 is a fixed resistor and may have a resistance value in the range of, for example, 25 kΩ to 127 kΩ.

The pull-down circuit 114 is able to turn on/off its own function by turning on/off the switching element SW2. In the following, turning on/off the pull-down circuit 114 means turning on/off a function of the pull-down circuit 114 by turning on/off the switching element SW2.

The drive device 120 is in the form of, for example, a control board, and has various electronic components mounted thereon. The drive device 120 includes a drive circuit 121 and the temperature sensor 122.

The drive circuit 121 is in the form including, for example, an inverter and a driver, and controls a current flowing through the motor 12 in response to a drive signal from the microcomputer 110.

The temperature sensor 122 is in the form of, for example, a thermistor, and generates an electric signal (analog signal) corresponding to a temperature at a position where the temperature sensor 122 is installed.

The temperature sensor 122 is connected to the terminal Tm1 of the microcomputer 110 via a wiring part 130. The wiring part 130 has one end connected to the terminal Tm1 of the microcomputer 110 and the other end connected to a terminal Tm2 of the temperature sensor 122.

In the example shown in FIG. 3, the temperature sensor 122 includes a thermistor 1222, a resistor 1223, and a capacitor 1224.

The thermistor 1222 is in the form of a variable resistor whose resistance value changes according to temperature. The thermistor 1222 may be, for example, a resistor whose resistance value changes in the range of 0.3 kΩ to 195 kΩ according to temperature. The thermistor 1222 is connected in series with the resistor 1223, and is connected between a power supply voltage 1221 (5 V in this example) and ground.

The resistor 1223 is in the form of a fixed resistor. The resistor 1223 is connected in series with the thermistor 1222. The resistor 1223 is disposed on the ground side. In a modification, the thermistor 1222 may be disposed on the ground side, and the resistor 1223 may be disposed on the power supply voltage 1221 side. A resistance value of the resistor 1223 is fixed and may be, for example, about 5 kΩ.

The capacitor 1224 has one end connected to a connection point P1 between the thermistor 1222 and the resistor 1223 and the other end connected to ground. Charges corresponding to a potential of the connection point P1 are accumulated in the capacitor 1224.

The connection point P1 between the thermistor 1222 and the resistor 1223 is connected to the terminal Tm2 of the temperature sensor 122. At the connection point P1 between the thermistor 1222 and the resistor 1223, a voltage is generated having a voltage value obtained by dividing the power supply voltage 1221 (5 V in this example) by the resistance value of the thermistor 1222 and the resistance value of the resistor 1223. Since this voltage value changes according to the resistance value of the thermistor 1222, temperature information can be obtained based on this voltage value.

Figure 4:
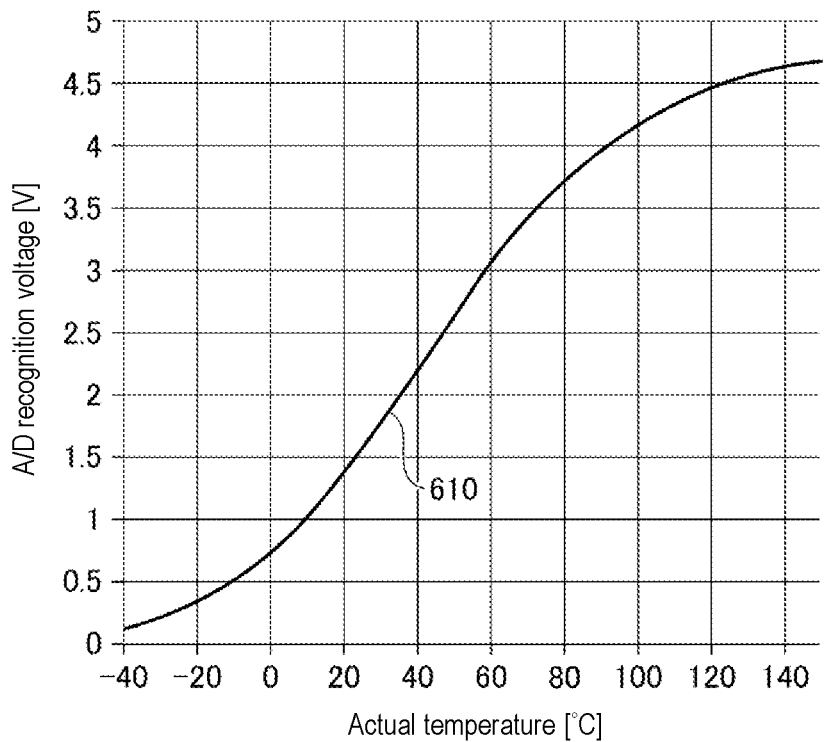
FIG. 4 is an explanatory diagram of an output characteristic of a temperature sensor.
Figure 5:
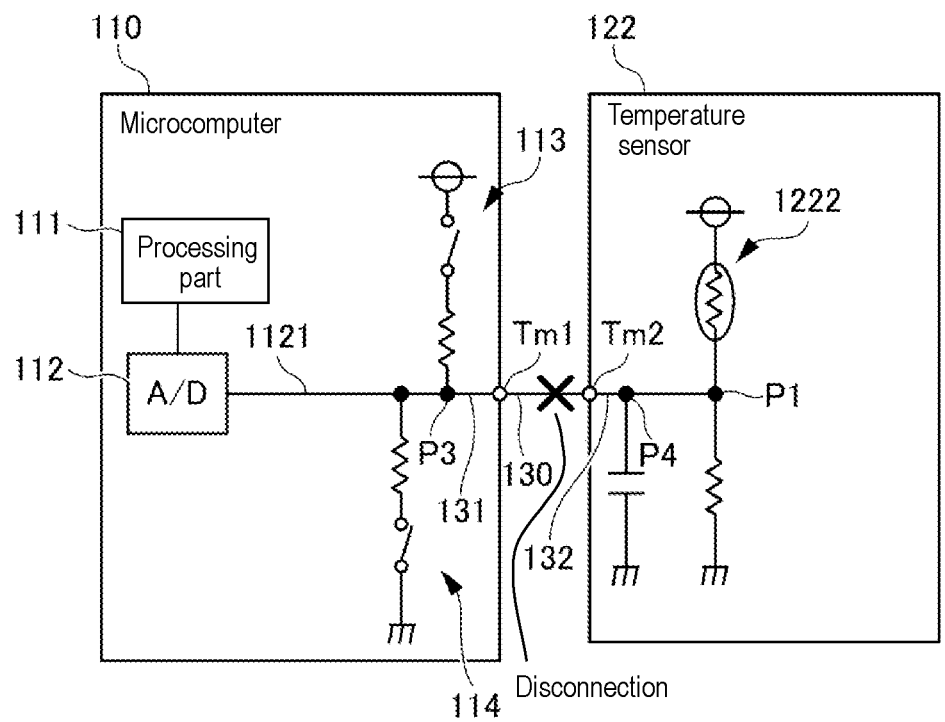
FIG. 5 is an explanatory diagram of disconnection in a wiring part.

FIG. 4 is an explanatory diagram of an output characteristic of the temperature sensor 122, in which the horizontal axis represents actual temperature, the vertical axis represents output (denoted as "A/D recognition voltage" in FIG. 4) of the A/D converter 112, and a curve of the output characteristic of the temperature sensor 122 is shown. FIG. 5 is an explanatory diagram of disconnection in the wiring part 130, in which a disconnection location is schematically indicated by the text "disconnection" together with an X mark.

In the example shown in FIG. 4, the output of the A/D converter 112 corresponding to the output of the temperature sensor 122 increases as the actual temperature increases. By utilizing such a characteristic, temperature information can be obtained based on the output of the A/D converter 112.

As schematically shown in FIG. 5, in the configuration in which the microcomputer 110 and the temperature sensor 122 are connected via the wiring part 130, disconnection may occur in the wiring part 130. Such disconnection causes the microcomputer 110 to be unable to obtain accurate temperature information. When disconnection occurs in the wiring part 130, a voltage (input voltage of A/D converter 112) having an indefinite value is generated in the terminal Tm1 of the microcomputer 110.

Such a trouble occurs with respect to not only disconnection in the wiring part 130, but also disconnection in a wiring part 131 in the input line 1121 in the microcomputer 110 between the terminal Tm1 and a connection point P3, or disconnection in a wiring part 132 in the temperature sensor 122 between the terminal Tm2 and a connection point P4. The connection point P3 corresponds to a connection point with the pull-up circuit 113 in the input line 1121, and the connection point P4 corresponds to a connection point with the capacitor 1224 in a signal line from the connection point P1 to the terminal Tm2. In the following, to simplify the description, the disconnection in the wiring part 130 will be described as a representative. However, the same applies to the disconnection in the wiring part 131 or the wiring part 132.

In the present embodiment, the microcomputer 110 detects disconnection in the wiring part 130 by using the pull-up circuit 113 or the pull-down circuit 114. Hereinafter, a method for detecting disconnection in the wiring part 130 is described in detail.

Figure 6:
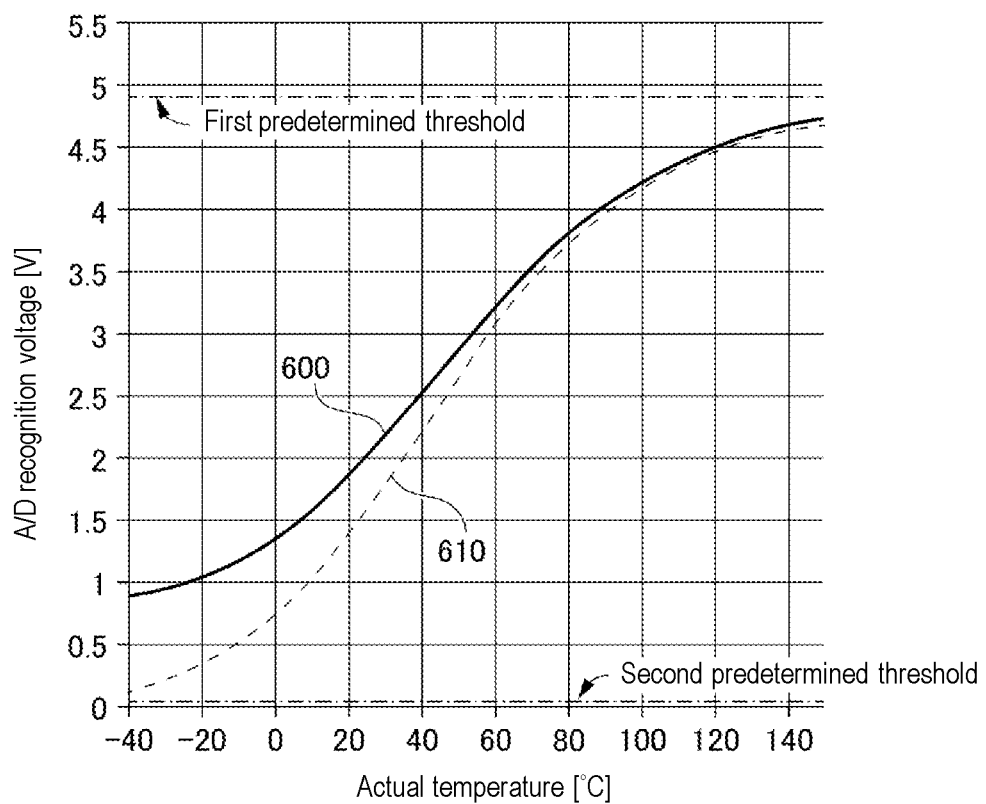
FIG. 6 is an explanatory diagram of an output characteristic of an A/D converter when a pull-up circuit is turned on in a normal mode.
Figure 7:
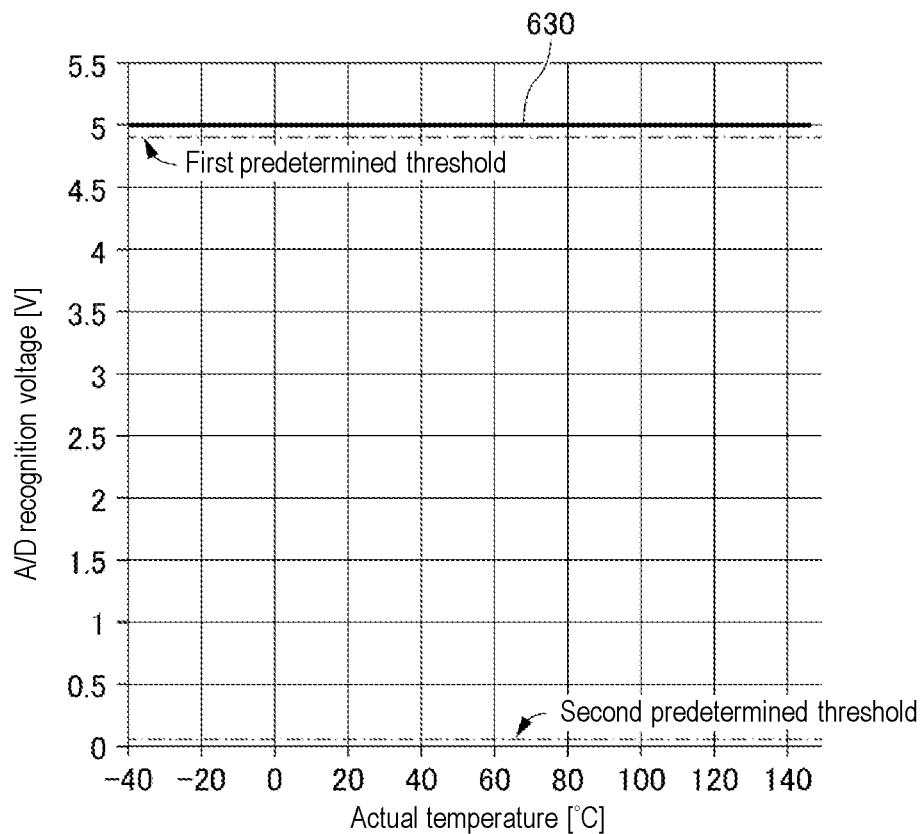
FIG. 7 is an explanatory diagram of an output characteristic of an A/D converter when a pull-up circuit is turned on in a case where disconnection has occurred in a wiring part.

FIG. 6 and FIG. 7 are explanatory diagrams of a detection method using the pull-up circuit 113, and are explanatory diagrams of output characteristics of the A/D converter 112 when the pull-up circuit 113 is turned on. The horizontal axis represents actual temperature, the vertical axis represents output (denoted as "A/D recognition voltage" in FIG. 6 and FIG. 7) of the A/D converter 112, and curves of the output characteristics of the A/D converter 112 are shown. FIG. 6 shows an output characteristic 600 of the A/D converter 112 in a case where no disconnection has occurred in the wiring part 130. FIG. 7 shows an output characteristic 630 of the A/D converter 112 in a case where disconnection has occurred in the wiring part 130. In FIG. 6, a characteristic 610 shown in FIG. 4 is shown by a dotted line for comparison.

As shown in FIG. 6, in the case where no disconnection has occurred in the wiring part 130, the output of the A/D converter 112 is affected by the output of the temperature sensor 122 and changes within a certain range significantly greater than 0 V and significantly less than 5V.

In contrast, in the case where disconnection has occurred in the wiring part 130, as shown in FIG. 7, the output of the A/D converter 112 sticks to a voltage value pulled up by the pull-up circuit 113 without being affected by the output of the temperature sensor 122. At this time, the output of the A/D converter 112 is significantly higher than a first predetermined threshold.

Accordingly, the following is known. Based on such a difference in the output of the A/D converter 112, that is, a difference occurring between the case where no disconnection has occurred in the wiring part 130 and the case where disconnection has occurred in the wiring part 130, disconnection in the wiring part 130 can be detected.

The same substantially applies in a case where the pull-down circuit 114 is turned on instead of the pull-up circuit 113. In this case, in the state in which disconnection has occurred in the wiring part 130, the output of the A/D converter 112 sticks to a voltage value pulled down by the pull-down circuit 114. At this time, the output of the A/D converter 112 is approximately 0 V. Accordingly, it is known that disconnection in the wiring part 130 can be detected based on such a difference in the output of the A/D converter 112.

In this way, according to the present embodiment, disconnection in the wiring part 130 can be detected by using the pull-up circuit 113 or the pull-down circuit 114.

Figure 8:
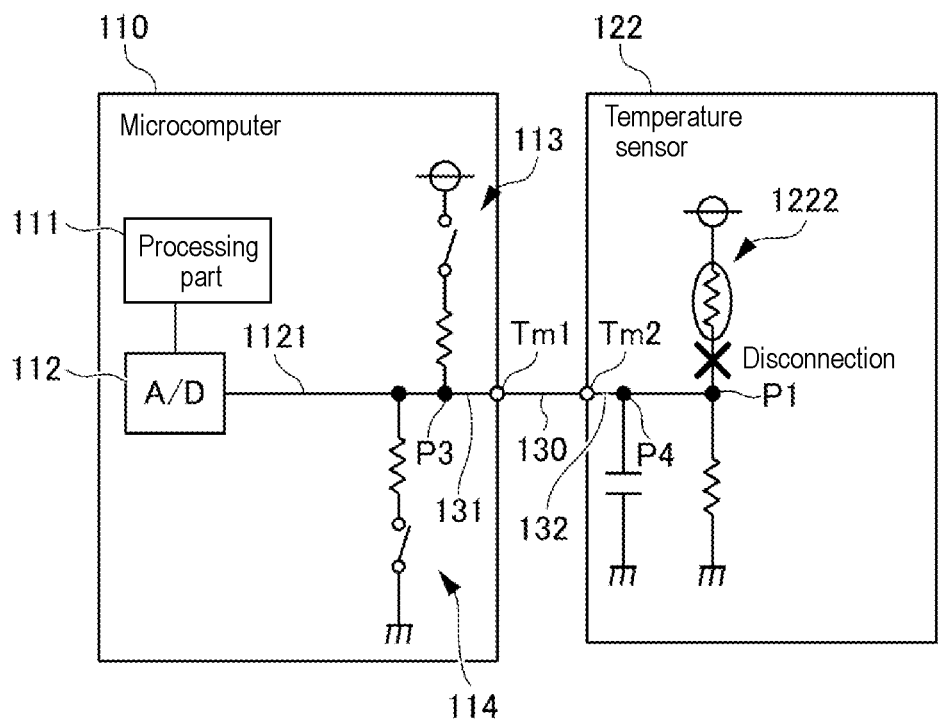
FIG. 8 is an explanatory diagram of a ground fault of a temperature sensor.

Next, details of functions of the processing part 111 of the microcomputer 110 will be described with reference to FIG. 8 and subsequent figures, while referring again to FIGS. 2 and 6. In the following, described is an example of detecting disconnection in the wiring part 130 by using the pull-up circuit 113. However, the pull-down circuit 114 may also be used, as described above. In the case of using the pull-up circuit 113, the pull-down circuit 114 is turned off; in the case of using the pull-down circuit 114, the pull-up circuit 113 is turned off. In a modification, both the pull-up circuit 113 and the pull-down circuit 114 may be used in a time-division manner.

As shown in FIG. 2, the microcomputer 110 includes a switch control part 200, a sensor information generator 210, a disconnection detector 220, and a sensor failure detector 230. The switch control part 200, the sensor information generator 210, the disconnection detector 220, and the sensor failure detector 230 can be realized by the CPU of the processing part 111 executing a program in the storage.

The switch control part 200 controls on/off states of the switching element SW1 of the pull-up circuit 113. In the present embodiment, the switch control part 200 turns on the switching element SW1 while a predetermined condition is satisfied. In this case, the switch control part 200 turns on the switching element SW1 when the predetermined condition is satisfied, and turns off the switching element SW1 when the predetermined condition is no longer satisfied.

Here, as shown in FIG. 6, the output characteristic 600 of the A/D converter 112 when the pull-up circuit 113 is on is different from the output characteristic 610 of the A/D converter 112 when the pull-up circuit 113 is off. Accordingly, in a configuration of generating temperature information based on a calculation formula adapted to the output characteristic 610, if the temperature information is generated based on the output characteristic 600, accurate temperature information cannot be obtained. That is, in the case of generating temperature information based on the output characteristic 600 by using the calculation formula adapted to the output characteristic 610, due to the influence of fluctuations that may be caused by the pull-up circuit 113, accurate temperature information cannot be obtained. To newly adapt the calculation formula based on the output characteristic 600, a complex calculation formula such as a high-order function is obtained, which is disadvantageous from the viewpoint of calculation load.

In view of this, the predetermined condition is preferably adapted so as to be satisfied only during a period during which acquisition of temperature information is unnecessary or a period during which acquisition of highly accurate temperature information is unnecessary. For example, the predetermined condition may be satisfied in relation to initialization or sleep mode. Specifically, the predetermined condition is satisfied over a part of or the whole of an initialization period of the microcomputer 110, and/or is satisfied over a part of or the whole of a sleep mode period of the microcomputer 110. Accordingly, the pull-up circuit 113 can be turned on under an appropriate condition that acquisition of temperature information or the like is unnecessary.

The sensor information generator 210 generates temperature information as sensor information based on a sensor signal from the temperature sensor 122. In the present embodiment, as described above, if the temperature information is generated based on the output of the A/D converter 112 when the pull-up circuit 113 is on by using the calculation formula adapted to the output characteristic 610, accurate temperature information cannot be obtained. Accordingly, the sensor information generator 210 generates the temperature information based on the sensor signal from the temperature sensor 122 when the pull-up circuit 113 is off by the calculation formula adapted to the output characteristic 610. Accordingly, while disconnection in the wiring part 130 is able to be detected by using the pull-up circuit 113, a trouble (decrease in accuracy of temperature information) caused by the pull-up circuit 113 can be prevented.

The disconnection detector 220 detects disconnection of the wiring part 130 based on the output of the A/D converter 112 when the pull-up circuit 113 is on. A method for detecting disconnection of the wiring part 130 is as described above with reference to FIG. 6. Specifically, the disconnection detector 220 detects disconnection of the wiring part 130 in the case where the output of the A/D converter 112 when the pull-up circuit 113 is on exceeds the first predetermined threshold. The first predetermined threshold may be set greater than an upper limit of a range that the output of the A/D converter 112 when the pull-up circuit 113 is on may take when no disconnection has occurred in the wiring part 130. For example, in the example shown in FIG. 6, the output characteristic 600 changes in a range having an upper limit significantly lower than 4.9 V. Accordingly, in this case, the first predetermined threshold may be set to 4.9 V.

In a configuration using the pull-down circuit 114, the disconnection detector 220 detects disconnection of the wiring part 130 in the case where the output of the A/D converter 112 when the pull-down circuit 114 is on falls below the second predetermined threshold. The second predetermined threshold may be set less than a lower limit of a range that the output of the A/D converter 112 when the pull-down circuit 114 is on may take when no disconnection has occurred in the wiring part 130. For example, the second predetermined threshold may be set to a value (for example, about 0.025 V) slightly greater than 0.

In the case where the disconnection detector 220 detects disconnection of the wiring part 130, the disconnection detector 220 may generate information (for example, diagnostic information) indicating the same. In this case, the host ECU 4 may generate an output instruction such as an alarm based on such information.

The sensor failure detector 230 detects various failures of the temperature sensor 122 based on the output of the A/D converter 112 when the pull-up circuit 113 is in the off state. Accordingly, the sensor failure detector 230 operates together with the sensor information generator 210 based on the output of the A/D converter 112 when the pull-up circuit 113 is in the off state.

Specifically, the sensor failure detector 230 detects a power fault in the temperature sensor 122 in the case where the output of the A/D converter 112 when the pull-up circuit 113 is in the off state exceeds a third predetermined threshold. At the time of the power fault of the temperature sensor 122, the output of the A/D converter 112 sticks to a value corresponding to the power supply voltage 1221, similarly to the output characteristic 630 of the A/D converter 112 (see FIG. 7) in the case where disconnection has occurred in the wiring part 130. Accordingly, in this case, the power fault of the temperature sensor 122 can be detected by the third predetermined threshold that is the same as the first predetermined threshold used for disconnection detection by the disconnection detector 220. That is, the third predetermined threshold may be the same as the first predetermined threshold used for disconnection detection by the disconnection detector 220.

A ground fault in the temperature sensor 122 is detected in the case where the output of the A/D converter 112 when the pull-up circuit 113 is in the off state falls below a fourth predetermined threshold. The ground fault of the temperature sensor 122 is caused by, for example, disconnection in a signal line from the power supply voltage 1221 (denoted in FIG. 3) to the connection point P1, as schematically shown in FIG. 8. Also in this case, since the power supply voltage 1221 is separated from the terminal Tm2 of the temperature sensor 122, the terminal Tm2 of the temperature sensor 122 has ground potential. Hence, when the temperature sensor 122 has a ground fault, the output of the A/D converter 112 sticks to 0 V. Accordingly, in this case, the ground fault of the temperature sensor 122 can be detected by the fourth predetermined threshold that is the same as the second predetermined threshold used for disconnection detection by the disconnection detector 220. That is, the fourth predetermined threshold may be the same as the second predetermined threshold when disconnection detection is performed using the pull-down circuit 114.

In the case where the sensor failure detector 230 detects a power fault or a ground fault in the temperature sensor 122, the sensor failure detector 230 may generate failure information (for example, diagnostic information) indicating the same. In this case, the host ECU 4 may generate an output instruction such as an alarm based on such information. The failure information may include information indicating the type (power fault or ground fault) of failure.

Next, an operation example of the microcomputer 110 related to disconnection detection or the like is described with reference to FIG. 9 to FIG. 12.

Figure 9:
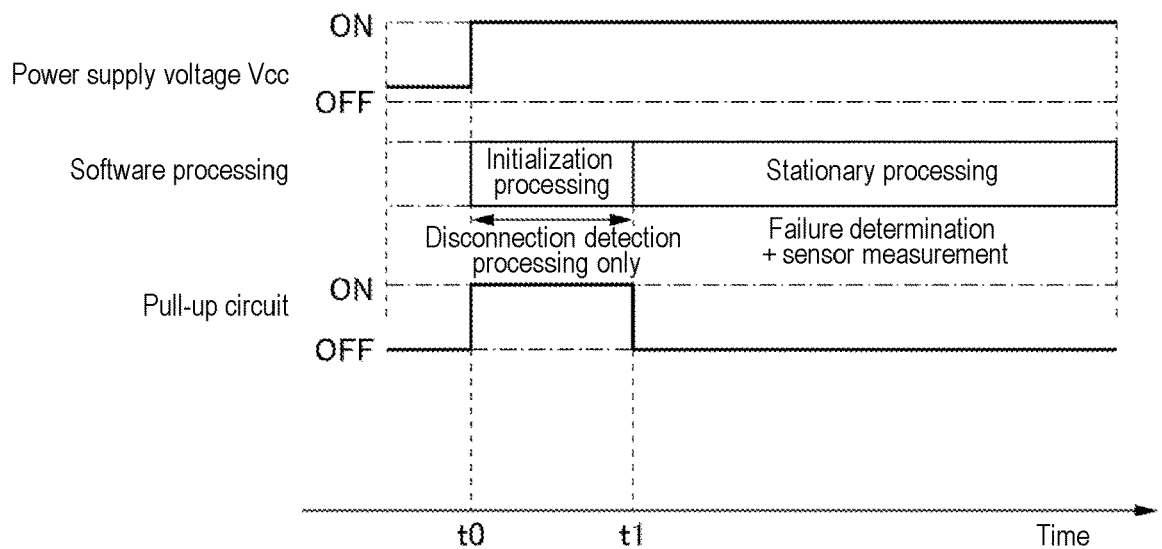
FIG. 9 is a timing chart in a case where disconnection detection processing by a disconnection detector is performed during initialization processing of a microcomputer.
Figure 10:
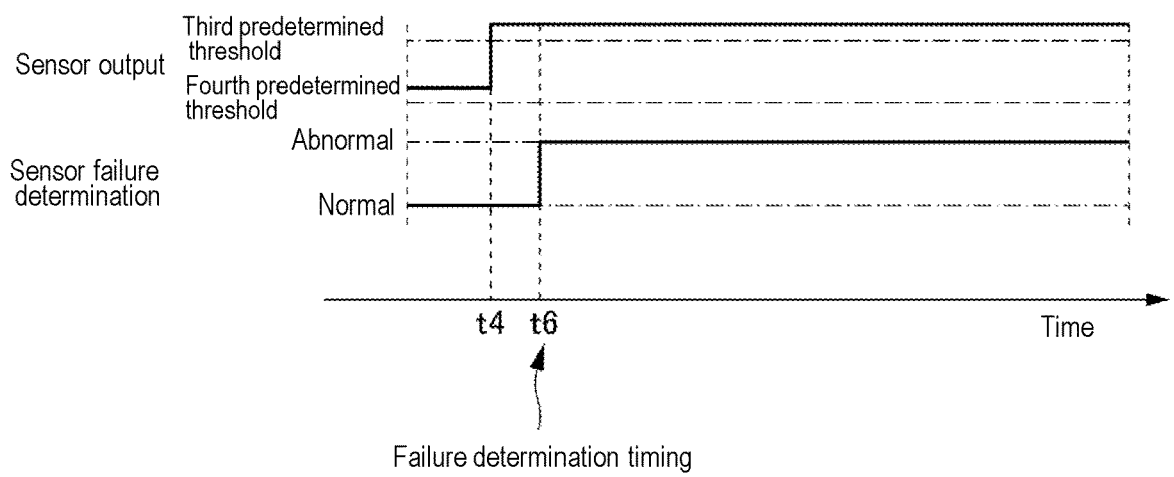
FIG. 10 is a timing chart of a power fault-related failure determination method by a sensor failure detector.
Figure 11:
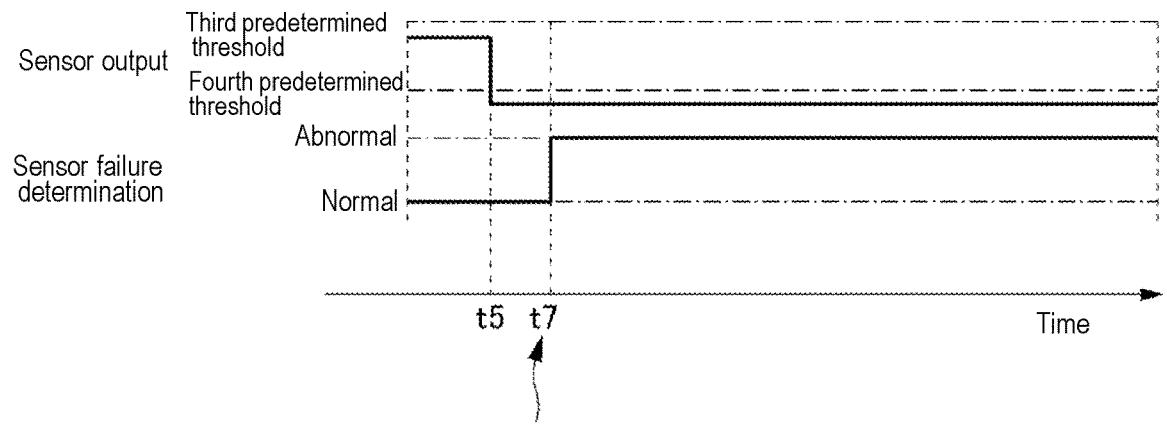
FIG. 11 is a timing chart of a ground fault-related failure determination method by a sensor failure detector.

FIG. 9 is a timing chart in a case where disconnection detection processing by the disconnection detector 220 is performed during initialization processing of the microcomputer 110. In FIG. 9, a time series waveform of the power supply voltage Vcc, a time series of the content of software processing, and a time series of the on/off state of the pull-up circuit 113 are shown in order from the upper side. FIG. 10 and FIG. 11 are timing charts of a failure determination method by the sensor failure detector 230. In each of FIG. 10 and FIG. 11, a time series of the output (denoted as "sensor output" in FIG. 10 and FIG. 11) of the temperature sensor 122 corresponding to the output of the A/D converter 112, and a time series of a sensor failure determination result are shown in order from the top.

In the example shown in FIG. 9, for example, when the power supply voltage Vcc rises at time point t0 as the vehicle is started, initialization processing of the microcomputer 110 is executed during a period from time point t0 to time point t1. The disconnection detection processing by the disconnection detector 220 is executed using the period from time point t0 to time point t1. Specifically, the pull-up circuit 113 is on during the period from time point t0 to time point t1, and based on the output of the A/D converter 112 when the pull-up circuit 113 is in the on state, the disconnection detection processing by the disconnection detector 220 is executed.

When the initialization processing of the microcomputer 110 is completed, the pull-up circuit 113 is turned off at time point t1, and stationary processing is executed. At this time, the sensor information generator 210 and the sensor failure detector 230 function, and sensor measurement (generation of temperature information) and failure determination of the temperature sensor 122 are executed. In this case, the failure determination of the temperature sensor 122 is realized, for example, in the manner shown in FIG. 10 and FIG. 11. In each of FIG. 10 and FIG. 11, a power fault and a ground fault occur at time points t4 and t5, respectively. Specifically, in the example shown in FIG. 10, a power fault occurs at time point t4, and the output of the temperature sensor 122 corresponding to the output of the A/D converter 112 sticks to a value (value higher than the third predetermined threshold) higher than an upper limit in a normal mode. In this case, due to detection of the power fault at a failure determination timing t6, the sensor failure determination result changes from "normal" to "abnormal". In the example shown in FIG. 11, a ground fault occurs at time point t5, and the output of the temperature sensor 122 corresponding to the output of the A/D converter 112 sticks to a value (value lower than the fourth predetermined threshold) lower than a lower limit in the normal mode. In this case, due to detection of the ground fault at a failure determination timing t7, the sensor failure determination result changes from "normal" to "abnormal".

In the example shown in FIG. 9, the pull-up circuit 113 is in the on state throughout the whole period of the initialization processing of the microcomputer 110. However, the pull-up circuit 113 may be turned on only during a period during which the disconnection detection processing by the disconnection detector 220 is executed in the whole period of the initialization processing.

Figure 12:
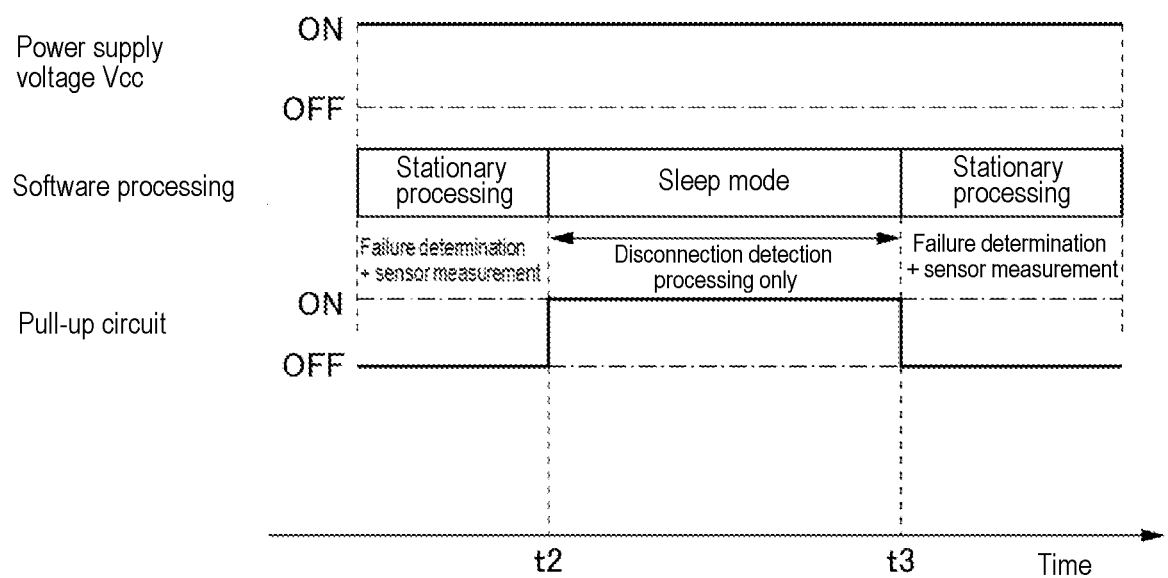
FIG. 12 is a timing chart in a case where disconnection detection processing by a disconnection detector is performed in a sleep mode of a microcomputer.

FIG. 12 is a timing chart in a case where the disconnection detection processing by the disconnection detector 220 is performed in the sleep mode of the microcomputer 110. In FIG. 12, similarly to FIG. 9, a time series waveform of the power supply voltage Vcc, a time series of the content of software processing, and a time series of the on/off state of the pull-up circuit 113 are shown in order from the upper side.

In the example shown in FIG. 12, the microcomputer 110 transitions to the sleep mode during a period from time point t2 to time point t3. The disconnection detection processing by the disconnection detector 220 is executed using the period from time point t2 to time point t3. Specifically, the pull-up circuit 113 is on during the period from time point t2 to time point t3, and based on the output of the A/D converter 112 when the pull-up circuit 113 is in the on state, the disconnection detection processing by the disconnection detector 220 is executed. When the sleep mode of the microcomputer 110 ends, the pull-up circuit 113 is turned off at time point t3, and stationary processing is executed. At this time, the sensor information generator 210 and the sensor failure detector 230 function, and sensor measurement (generation of temperature information) and failure determination of the temperature sensor 122 are executed.

In the example shown in FIG. 12, the pull-up circuit 113 is in the on state throughout the whole period of the sleep mode of the microcomputer 110. However, the pull-up circuit 113 may be turned on only during a period during which the disconnection detection processing by the disconnection detector 220 is executed in the whole period of the sleep mode. It is not always necessary to execute the disconnection detection processing for each sleep mode, and the disconnection detection processing may be executed in the sleep mode after a predetermined period of time or more has elapsed from the previous disconnection detection processing.

Although the embodiments of the disclosure have been described in detail with reference to the drawings, the specific configuration is not limited thereto, and designs and the like within the scope not deviating from the gist of the disclosure are also included.

For example, in the embodiments described above, the temperature sensor 122 is a sensor that inputs an analog sensor signal to the microcomputer 110. However, such a sensor may be one other than the temperature sensor 122. For example, the sensor that inputs an analog sensor signal to the microcomputer 110 may be a current sensor, a voltage sensor, a rotation angle sensor, or the like.

Regarding the above embodiments, the following supplementary notes are further disclosed.

[Supplementary Note 1]

A control system (for example, motor drive system 2 or motor control device 10) including: a semiconductor chip (for example, microcomputer 110), having built therein a processing part (111), an A/D converter (112) and a pull device circuit (113, 114); a wiring part (130, 131, 132), having one end connected to a terminal connected to the A/D converter; and a sensor (for example, temperature sensor 122), connected to the other end of the wiring part and inputting a sensor signal in analog form to the terminal via the wiring part, in which the pull device circuit includes a switching element (SW1, SW2), and has one end connected to ground or a power supply voltage and the other end connected between the A/D converter and the terminal; the processing part includes: a switch control part (200), controlling the switching element to be in an on or off state; a sensor information generator (210), generating sensor information based on the sensor signal; and a disconnection detector (220), detecting disconnection of the wiring part based on output of the A/D converter when the switching element is in the on state.

According to the configuration of supplementary note 1, the following control system can be obtained. In the configuration in which the sensor signal in analog form is input to the terminal of the semiconductor chip via the wiring part, it is possible to detect disconnection of the wiring part without adding a new component (by using the pull device circuit built in the semiconductor chip).

[Supplementary Note 2]

The control system as described in supplementary note 1, in which the sensor information generator generates the sensor information based on the output of the A/D converter when the switching element is in the off state.

According to the configuration of supplementary note 2, highly accurate sensor information can be obtained in a mode not affected by the pull device circuit.

[Supplementary Note 3]

The control system as described in supplementary note 1 or 2, in which the switch control part turns on the switching element while a predetermined condition is satisfied.

According to the configuration of supplementary note 3, a period during which the pull device circuit and the accompanying disconnection detector function can be appropriately limited.

[Supplementary Note 4]

The control system as described in supplementary note 3, in which the predetermined condition is satisfied in relation to initialization or sleep mode.

According to the configuration of supplementary note 4, the pull device circuit and the accompanying disconnection detector are able to function in relation to the initialization or the sleep mode being a timing at which it is less necessary to obtain the sensor information.

[Supplementary Note 5]

The control system as described in any one of supplementary notes 1 to 4, in which the disconnection detector detects the disconnection of the wiring part in response to the output of the A/D converter when the switching element is in the on state exceeding a first predetermined threshold or falling below a second predetermined threshold.

According to the configuration of supplementary note 5, disconnection of the wiring part can be accurately detected based on a relationship between the output of the A/D converter and a predetermined threshold.

[Supplementary Note 6]

The control system as described in supplementary note 5, in which the processing part further includes a sensor failure detector (230); the sensor failure detector detects a power fault in the sensor in response to the output of the A/D converter when the switching element is in the off state exceeding a third predetermined threshold, and the sensor failure detector detects a ground fault in the sensor in response to the output of the A/D converter when the switching element is in the off state falling below a fourth predetermined threshold.

According to the configuration of supplementary note 6, not only disconnection of the wiring part but also a power fault or a ground fault in the sensor can be detected. Since a power fault or a ground fault in the sensor can be detected based on the output used when obtaining the sensor information, the failure can be quickly detected when it occurs.

[Supplementary Note 7]

A disconnection detection method in a control system, the control system including: a semiconductor chip, having built therein a processing part, an A/D converter and a pull device circuit; a wiring part, having one end connected to a terminal connected to the A/D converter; and a sensor, connected to the other end of the wiring part and inputting a sensor signal in analog form via the wiring part, in which the pull device circuit includes a switching element, and has one end connected to ground or a power supply voltage and the other end connected between the A/D converter and the terminal, the disconnection detection method includes: controlling the switching element to be in an on or off state by the processing part; generating sensor information based on the sensor signal by the processing part; and detecting disconnection of the wiring part based on output of the A/D converter when the switching element is in the on state.

According to the configuration of supplementary note 7, the following disconnection detection method can be obtained. In the control system in which the sensor signal in analog form is input to the terminal of the semiconductor chip via the wiring part, it is possible to detect disconnection of the wiring part without adding a new component (by using the pull device circuit built in the semiconductor chip).

[Supplementary Note 8]

A disconnection detection program in a control system, the control system including: a semiconductor chip, having built therein a processing part, an A/D converter and a pull device circuit; a wiring part, having one end connected to a terminal connected to the A/D converter; and a sensor, connected to the other end of the wiring part and inputting a sensor signal in analog form via the wiring part, in which the pull device circuit includes a switching element, and has one end connected to ground or a power supply voltage and the other end connected between the A/D converter and the terminal, the disconnection detection program causes the processing part to execute: processing for controlling the switching element to be in an on or off state; processing for generating sensor information based on the sensor signal; and processing for detecting disconnection of the wiring part based on output of the A/D converter when the switching element is in the on state.

According to the configuration of supplementary note 8, the following disconnection detection program can be obtained. In the control system in which the sensor signal in analog form is input to the terminal of the semiconductor chip via the wiring part, it is possible to detect disconnection of the wiring part without adding a new component (by using the pull device circuit built in the semiconductor chip).

What is claimed is:

1. A control system comprising:
a semiconductor chip, having built therein a processing part, an A/D converter and a pull device circuit;
a wiring part, having one end connected to a terminal connected to the A/D converter; and
a sensor, connected to the other end of the wiring part and inputting a sensor signal in analog form to the terminal via the wiring part, wherein
the pull device circuit comprises a switching element, and has one end connected to ground or a power supply voltage and the other end connected between the A/D converter and the terminal;
the processing part comprises:
a switch control part, controlling the switching element to be in an on or off state;
a sensor information generator, generating sensor information based on the sensor signal; and
a disconnection detector, detecting disconnection of the wiring part based on output of the A/D converter when the switching element is in the on state, wherein the disconnection detector detects the disconnection of the wiring part in response to the output of the A/D converter when the switching element is in the on state exceeding a first predetermined threshold or falling below a second predetermined threshold,
wherein the processing part further comprises a sensor failure detector, and the sensor failure detector detects a power fault in the sensor in response to the output of the A/D converter when the switching element is in the off state exceeding a third predetermined threshold, and the sensor failure detector detects a ground fault in the sensor in response to the output of the A/D converter when the switching element is in the off state falling below a fourth predetermined threshold.

2. The control system according to claim 1, wherein the sensor information generator generates the sensor information based on the output of the A/D converter when the switching element is in the off state.

3. The control system according to claim 1, wherein the switch control part turns on the switching element while a predetermined condition is satisfied.

4. The control system according to claim 3, wherein the predetermined condition is satisfied in relation to initialization or sleep mode.

5. A disconnection detection method in a control system, the control system comprising:
a semiconductor chip, having built therein a processing part, an A/D converter and a pull device circuit;
a wiring part, having one end connected to a terminal connected to the A/D converter; and
a sensor, connected to the other end of the wiring part and inputting a sensor signal in analog form to the terminal via the wiring part, wherein the pull device circuit comprises a switching element, and has one end connected to ground or a power supply voltage and the other end connected between the A/D converter and the terminal, wherein the disconnection detection method comprises:

controlling the switching element to be in an on or off state by the processing part;

generating sensor information based on the sensor signal by the processing part;

detecting, by the processing part, disconnection of the wiring part based on output of the A/D converter when the switching element is in the on state, wherein the disconnection of the wiring part is detected in response to the output of the A/D converter when the switching element is in the on state exceeding a first predetermined threshold or falling below a second predetermined threshold; and detecting, by the processing part, a power fault in the sensor in response to the output of the A/D converter when the switching element is in the off state exceeding a third predetermined threshold, and a ground fault in the sensor in response to the output of the A/D converter when the switching element is in the off state falling below a fourth predetermined threshold.

6. A non-transitory computer-readable medium storing a disconnection detection program in a control system, the control system comprising:

a semiconductor chip, having built therein a processing part, an A/D converter and a pull device circuit;

a wiring part, having one end connected to a terminal connected to the A/D converter; and a sensor, connected to the other end of the wiring part and inputting a sensor signal in analog form to the terminal via the wiring part, wherein the pull device circuit comprises a switching element, and has one end connected to ground or a power supply voltage and the other end connected between the A/D converter and the terminal, wherein the disconnection detection program causes the processing part to execute:

processing for controlling the switching element to be in an on or off state;

processing for generating sensor information based on the sensor signal;

processing for detecting disconnection of the wiring part based on output of the A/D converter when the switching element is in the on state, wherein the disconnection of the wiring part is detected in response to the output of the A/D converter when the switching element is in the on state exceeding a first predetermined threshold or falling below a second predetermined threshold; and processing for detecting a power fault in the sensor in response to the output of the A/D converter when the switching element is in the off state exceeding a third predetermined threshold, and detecting a ground fault in the sensor in response to the output of the A/D converter when the switching element is in the off state falling below a fourth predetermined threshold.

7. The control system according to claim 2, wherein the switch control part turns on the switching element while a predetermined condition is satisfied.

* * * * *